United States Patent [19]

Koskenmaki et al.

[11] Patent Number: 5,028,490
[45] Date of Patent: Jul. 2, 1991

[54] METAL/POLYMER COMPOSITES

[75] Inventors: David C. Koskenmaki, St. Paul; Clyde D. Calhoun, Stillwater, both of Minn.; Brett E. Huff, Sunnyvale, Calif.

[73] Assignee: Minnesota Mining and Manufacturing Co., St. Paul, Minn.

[21] Appl. No.: 270,532

[22] Filed: Nov. 14, 1988

[51] Int. Cl.$^5$ ............................ B32B 5/02; H05K 9/00; B22D 19/00

[52] U.S. Cl. .................................. 428/594; 428/608; 428/626; 428/138; 428/256; 29/527.5; 174/35 MS

[58] Field of Search ............... 428/256, 247, 137, 138, 428/608, 626, 594; 174/35 MS; 29/527.1, 527.5; 164/98

[56] References Cited

U.S. PATENT DOCUMENTS

| | | | |
|---|---|---|---|
| 2,226,384 | 12/1940 | Norris | 204/11 |
| 2,416,202 | 2/1947 | Naumann | 174/35.4 |
| 2,674,644 | 4/1954 | Goodloe | 428/256 |
| 3,265,804 | 8/1966 | Berger et al. | 174/35 MS |
| 3,505,144 | 4/1970 | Kilduff et al. | 428/256 |
| 3,734,762 | 5/1973 | Hackman et al. | 29/527.5 |
| 3,745,466 | 7/1973 | Pisano | 174/35 MS |
| 4,037,009 | 7/1977 | Severinsen | 174/35 MS |
| 4,101,689 | 7/1978 | Wienand et al. | 428/137 |
| 4,115,619 | 9/1978 | Kurfman et al. | 428/336 |
| 4,211,822 | 8/1980 | Kurfman et al. | 428/412 |
| 4,275,116 | 6/1983 | Kratschmer | 428/336 |
| 4,435,465 | 3/1984 | Ebneth et al. | 174/35 MS |
| 4,472,471 | 9/1984 | Klein et al. | 428/256 |
| 4,510,208 | 4/1985 | Kurfman et al. | 428/624 |
| 4,533,685 | 8/1985 | Hudgin et al. | 523/457 |
| 4,612,216 | 9/1986 | Kurfman et al. | 427/250 |
| 4,631,214 | 12/1986 | Hasegawa | 428/256 |
| 4,639,396 | 1/1987 | Semsarzadeh | 428/373 |
| 4,678,699 | 7/1987 | Kritchevsky et al. | 428/247 |
| 4,755,422 | 7/1988 | Headrick et al. | 428/256 |
| 4,863,789 | 9/1989 | Arai | 428/256 |
| 4,880,679 | 11/1989 | Bonazza | 428/256 |

FOREIGN PATENT DOCUMENTS

| | | |
|---|---|---|
| 2338123 | 7/1973 | Fed. Rep. of Germany ........ 174/35 MS |
| 3535807 | 4/1986 | Fed. Rep. of Germany ........ 174/35 MS |

Primary Examiner—John J. Zimmerman
Attorney, Agent, or Firm—Merchant, Gould, Smith, Edell, Welter & Schmidt

[57] ABSTRACT

The present invention provides a discontinuous metal/polymer composite, with a metal layer, formed from a plurality of fine metal strands, which may be used, for example, in static or EMI shielding. The metal layer comprises a plurality of fine metal strands provided on the substrate, the metal strands individually having a cross-section with an area of about 100 to 100,000 $\mu m^2$ and the cross-section of the individual metal strands having a flat portion and an arcuate portion. The metal and polymer may be selected so that the composite is capable of being thermoformed without loss of electrical conductivity or transparency.

30 Claims, 2 Drawing Sheets

METAL/POLYMER COMPOSITES

FIELD OF THE INVENTION

This invention relates to metal/polymer composites, and particularly to such composites which have a layer comprising a plurality of fine metal strands. The invention also relates to a method of squirting fine metal strands onto a substrate.

BACKGROUND OF THE INVENTION

A variety of different metal and polymeric composites are known and are used in many, varied applications. One important use for a metal/polymer composite is as a shield for a variety of electromagnetic and radio frequency waves. Such waves, which cause interference in a variety of devices, are commonly referred to as electromagnetic interference (EMI) and radio frequency interference (RFI) (hereinafter jointly referred to as EMI). Shielding from EMI is often placed around an EMI source to prevent it from radiating EMI and interferring with surrounding devices. Also, the devices themselves may be provided with EMI shielding in an effort to shield the device from incoming EMI.

Another important use for a metal/polymer composite is for the protection of sensitive electronic parts from static charges. Static charge build-up can result from, for example, friction between surfaces, and can lead to a build-up of a high electrical potential. A sensitive electronic part that may come into proximity or contact with a statically charged surface can be destroyed or damaged. During shipping or handling, shielding of an electronic part from static electricity can be accomplished by placing the part in an electrically conductive metal or metal/polymer container, with the metal providing a preemptive surface to drain away any static charge.

Metal is a well-known, effective shield against EMI. However, many applications require that the shielding be transparent, while also being electrically conductive to aid in the dissipation of EMI. In addition, many applications require that the EMI shielding be thermoformed into a required shape or structure. A thermoforming process comprises heating the material and forming the material into the desired shape. As used herein, thermoforming refers to both stretching a material while heated and also heat-shrinking a material. Metal is also relatively heavy compared to polymeric materials, and therefore, where weight is a factor the amount of metal is desirably reduced.

Another desirable characteristic of an EMI or static shielding is of course cost. Since many metals are relatively expensive, it is desirable to be able to utilize sufficient metal to accomplish the objective, while closely tailoring the amount of metal to that desired amount. This also allows the weight of the composite to be kept to a minimum.

In addition to the cost of the metal itself, metal fabrication is generally a costly procedure. Separately fabricating a wire mesh or screen for lamination to a polymer is relatively costly. Further, handling of wire meshes can present difficulties, especially for fine meshes or screens of soft metals.

Metal/polymer composites having continuous coatings of metal are known. Continuous metal coatings are typically deposited by vapor deposition, sputtering or the like. To obtain coatings thick enough for good electrical conductivity, such processes are typically time consuming and relatively expensive. Also, such coatings are not transparent, and are therefor undesirable for certain uses.

Therefore, a need exists for an economical metal/polymer composite which may be used, for example, in EMI or static shielding. There is also a need for a metal/polymer composite which is electrically conductive, transparent, and which, if desired, is able to be thermoformed, without loss of either electrical conductivity or transparency. There is also a need for such a metal/polymer composite which includes precisely arranged fine metal strands, the amount of metal closely tailored to that amount necessary to accomplish the desired task. There is a further need for a metal/polymer composite with a metal layer comprising a plurality of fine metal strands in a random configuration. Further, there is a need for a method of making a suitable metal/polymer composite without the need for separate fabrication of a metal structure, such as a wire mesh or screen.

SUMMARY OF THE INVENTION

The present invention provides a metal/polymer composite, with a discontinuous metal layer, formed from a plurality of fine metal strands, which may be used, for example, in static or EMI shielding. The metal/polymer composite may be electrically conductive in one or more directions or locally conductive as desired. The discontinuous metal layer may also be transparent. The metal may be selected so that the composite is capable of being thermoformed without loss of electrical conductivity or transparency.

The metal/polymer composite comprises a polymeric substrate including a discontinuous metal layer. The metal layer comprising a plurality of fine metal strands provided on the substrate, the metal strands individually having a cross section with an area of about 100 to 100,000 $\mu m^2$ and the cross section having a flat portion and an arcuate portion. Where thermoformability is desired, the metal has a melting point of less than the softening or melting temperature of the polymeric substrate.

The metal may be arranged in a number of configurations. One preferred embodiment is a mesh configuration comprising a plurality of regularly spaced, horizontal and vertical strands substantially perpendicular to each other. The strands of metal may be spaced precisely at extremely close spacings, for example, spaced at an average spacing of between 2 and about 200 strands per cm. The metal layer may also be a random wandering pattern of a plurality of fine strands of metal.

The present invention also includes a method of forming a metal/polymer composite comprising the steps of: (a) providing a polymeric substrate having a conductor support surface; and (b) squirting a plurality of molten metal strands onto said conductor support surface in a desired pattern.

As used herein, "transparent" means allowing at least portions of visible light to pass therethrough. The amount of optical clarity which is required will vary with the desired end use of the composite. "Electrically conductive" means at least locally electrically conductive in a at least one directtion. "Discontinuous" means that a metal film or foil is not used, but rather continuous or substantially continuous metal strands are arranged on a surface. "Fine" means a strand having a cross sectional area which is less than 100,000 $\mu m^2$.

DETAILED DESCRIPTION OF THE INVENTION

The present invention provides a metal/polymer composite which comprises a plurality of fine metal strands provided on a polymeric substrate. The composite is electrically conductive, and can be transparent and thermoformable. The invention also provides a method of squirting fine metal strands onto a substrate in a desired configuration, ranging from precise evenly spaced lines to a random, wandering configuration. The metal/polymer composite comprises a polymeric substrate with strands of metal and squirted thereon in the desired configuration. The metal layer is a discontinuous layer comprised of a plurality of metal strands. To allow thermoforming of the metal/polymer composite without loss of electrical conductivity or transparency, the melting point of the metal is less than the softening or melting temperature of the polymeric substrate.

SUBSTRATES

A wide range of polymers are suitable for use as substrates in the present invention. Where it is advantageous for the composite of the present invention to allow substantial portions of visible light to pass therethrough, it is desirable that the material selected as the polymeric substrate be at least partially transparent to the visible region of light. In many applications, it may not be necessary that the polymer have a glass-like transparency, and in many cases this may be undesirable. The polymer may be cloudy, colored, partially opaque or the like, as required by the particular end use.

Where it is desired that the metal/polymer composite be thermoformable, the polymeric material selected as the substrate should be able to be formed under heat and pressure into the desired configuration (thermoformed). The thermoforming process may stretch the heated polymer, for example, to preferably at least 50 percent and more preferably, at least 200 percent, or it may shrink when heated to, for example, at least 25 percent less than its original dimensions. In addition, in some applications only certain regions of the composite are stretched, for example, to greater than 200 percent of the local or regional dimension.

Suitable polymers for use in the composite of the present invention include polyamides; polyolefins, including ethylene, propylene, methylpentene and blends thereof; polyurethanes; polysulfones; polycarbonates; linear polyesters, such as polyethyleneterephthalate and polybutlyene terephthalate; cellulose esters, such as cellulose acetate, and cellulose propionate; halogenated polyolefins; polyacetals; ABS (acrylonitrile butadiene styrene) resins; polyphenylene oxide plus styrene resin (Noryl®); the alkenyl aromatic resins typified by polystyrene, styrene copolymers, blends and graft copolymers; and the alkenyl aromatic resins typified by polystyrene copolymers. Included in the term polymer are homopolymers, oligopolymers and blends of two or more polymeric materials.

Preferred polymers include a polyester formed from terephthalic acid and one or more diols selected from the group consisting of ethylene glycol, propylene glycol, 1,4 butane diol, 1,6 hexane diol, and 1,4 cyclohexane dimethanol.

In addition to polymers, the method of the present invention may be used to provide a plurality of fine metal strands onto the surface of a non-polymeric substrate such as ceramic, glass, metal and the like. The use of certain substrates may require a primer layer or coating to enable the metal strands to adhere to the substrate. In certain applications, it may be desirable that the metal strands do not adhere well to the substrate, for example, when transferability of the metal strands is desired. In such cases, a non-adhering substrate such as a polyimide may be utilized.

METALS

A wide variety of metals may be used. Where thermoformability is desired, a metal having a melting point of less than the softening point or melting temperature of the polymer, is utilized. Examples of preferred metals for use in the composite of the present invention include tin, lead, bismuth, zinc, indium, aluminum, and their alloys (including alloys of these metals with higher melting point metals), and mixtures thereof. Higher melting point metals are also suitable where thermoformability is not desired.

The metals, metal alloys or mixtures of metals and metal alloys are preferably utilized in a substantially pure form. It is unnecessary, and often undesirable, to include polymeric binders which are found, for example, in metal inks, or other fillers or additives. The metal is applied in a molten state through a fine orifice, such as a capillary or needle. Therefore, it is preferable that the metal not include substances which could clog or otherwise hamper the application of the typically fine strand of metal, which is applied to the conductor support surface of the polymer.

The metal is substantially undrawn when it solidifies from the molten state in which it is applied to the substrate. Many screens and other mesh configurations which are woven from fine strands of metal are drawn or stressed during processing.

The metal layer of the present invention comprises a plurality of fine metal strands individually having a cross section with an area of about 100 to 100,000 $\mu m^2$. The cross section of the individual strands is preferably 100 to 10,000 $\mu m^2$, and where very fine strands are desired, such as in use in static control shielding, the cross sectional area is about 100 to 7500 $\mu m^2$. Because the method of the present invention applies the metal strand onto the substrate in the form of a molten metal, the cross section of the individual strands will include a flat portion and an arcuate portion. The flat portion of the individual strands being that portion of the metal strand in contact with the substrate. As is discussed in more detail hereinbelow, the cross section of the individual strands is varied depending upon the angle at which it is deposited onto the substrate. The cross section of the individual strands may vary from almost a complete circular cross section, with a small flat portion, to a larger flat portion and an arcuate portion representing a small segment of a circle. In addition, where the fine metal strands are provided in an intersecting arrangement, such as a mesh or random intersecting configuration, the plurality of fine metal strands will have a plurality of fused junctions. The intersections will be fused because one or both of the strands will be in the molten form when the junction therebetween is formed.

METHOD OF MAKING

The present invention also includes a method for applying molten fine metal strands to a substrate to make, for example, a metal/polymer composite. The metal layer of the composite comprises fine strands of metal arranged in a variety of configurations including precisely and regularly spaced strands and random or wandering configurations of strands. The metal layer is provided in a desired configuration on the surface of a substrate.

In general terms, the method of the invention comprises the steps of: (a) providing a substrate; and (b) squirting a plurality of molten metal stands onto a surface of the substrate. If thermoformability is desired, the metal has a melting temperature of less than the softening or melting temperature of the polymeric substrate. The metal is provided in a desired patten which may vary from extremely precise to extremely random. If transparency is desired, the metal layer configuration should allow substantial portions of visible light to pass therethrough. The method may also be used to make a pattern which is opaque.

The metal/polymer composite may be thermoformed into a desired shape or configuration, suitable for the desired end use. In thermoforming, the composite is typically stretched at least 50 percent and often 200 percent and more. Composites of the present invention are capable of being thermoformed and stretched while retaining electrical conductivity, and transparency. In addition, it may be desirable to heatshrink the composite, again while maintaining electrical conductivity and transparency of the metal/polymer composite.

Figure 1:
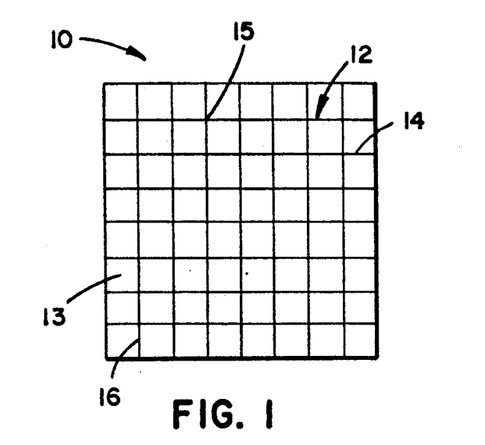
FIG. 1 is a schematic plan view of a uniform mesh configuration of the present invention.

Referring to FIG. 1, a metal/polymer composite 10 is shown having a metal pattern 12 on a polymeric substrate 13. The metal pattern 12 is in a mesh configuration having horizontal strands 14 and vertical strands 16 which are substantially perpendicular to the horizontal strands 14. The horizontal and vertical strands 14 and 16 are regularly spaced apart at desired intervals. The strands 14 and 16 intersect at a plurality of fused junctions 15. The mesh pattern 12 provides electrical conductivity in both X and Y directions. A configuration like that shown in FIG. 1 with more than one set of parallel lines can be made by depositing a single direction set of lines on a substrate and laminating two or more such substrates together in the desired configuration, such as perpendicular.

Figure 2:
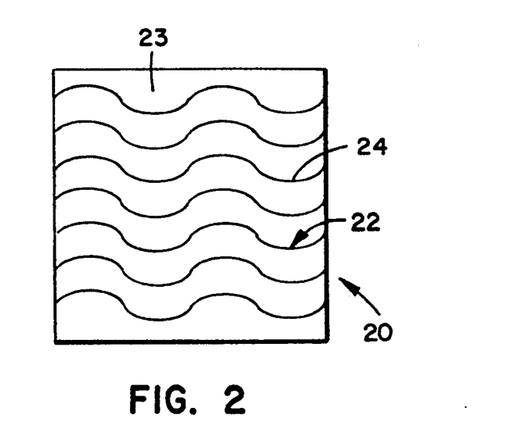
FIG. 2 is a schematic plan view of a regular sine wave configuration of the present invention.

Referring to FIG. 2, a second configuration of a metal/polymer composite 20 is shown having a metal pattern 22 on a polymeric substrate 23. The pattern 22 is in the shape of sine waves which are closely spaced at regular intervals. Each metal strand 24 has a sine wave configuration. Each sine wave has a similar period so that the sine waves do not cross thus providing electrical conductivity in the X direction but not in the Y direction.

Figure 3:
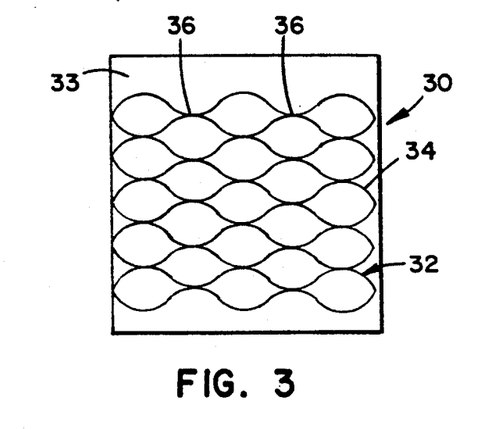
FIG. 3 is a schematic plan view of an opposed sign wave configuration of the present invention.

Referring to FIG. 3, a metal/polymer composite 30 is shown having a metal pattern 32 on a polymeric substrate 33, which is made up of metal strands 34, each metal strand 34 having the shape of a regularly repeating sine wave. The metal strands 34 are oppositely opposed so that a plurality of fused junctions 36 are provided.

Figure 4:
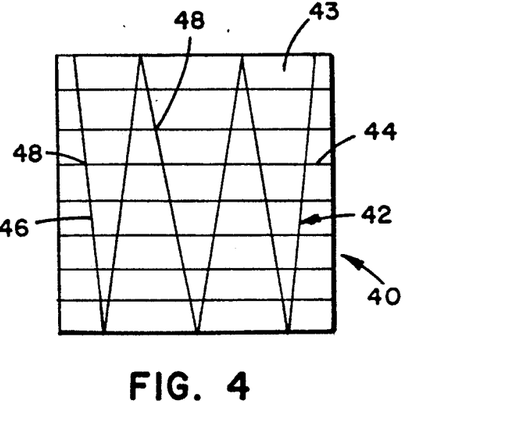
FIG. 4 is a schematic plan view of a cross-hatched configuration of the present invention.

Referring to FIG. 4, an additional embodiment of the invention is shown, a metal/polymer composite 40 having a metal pattern 42 on a polymeric substrate 43. The pattern 42 which includes horizontal strands 44 and a periodic bisector 46 which has a zigzag configuration providing electrical connection between the horizontal strands 44 at a plurality of fused junctions 48.

Figure 5:
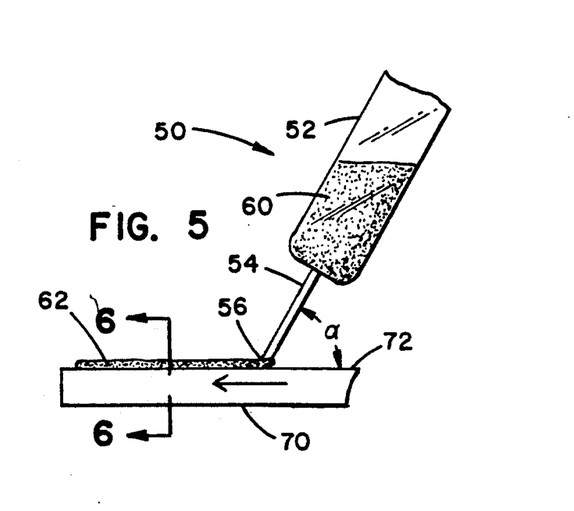
FIG. 5 is a schematic side view of one step in the method of the invention depicting the metal strand being deposited onto a moving substrate.

Referring to FIG. 5, a step in the method of the present invention is shown. A metal dispenser generally designated 50 having a vessel portion 52, and a nozzle portion 54 with a orifice 56, is shown. The vessel 52 of the dispenser 50 contains a molten metal 60. The molten metal 60 is squirted through the orifice 56 in the form of a fine metal strand 62. A substrate 70, moving in the direction of the arrow, is moved past the orifice 56 to provide the thin metal strand 62 on a substrate surface 72. The angle between the nozzle 54 and the substrate surface 72 has been designated alpha.

Figure 6:
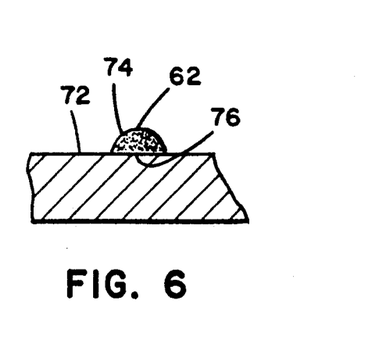
FIG. 6 is a cross-section of a single metal strand along 6—6 of FIG. 4.

Referring to FIG. 6 a cross-sectional view along the line 6—6 of FIG. 5 is shown. The metal strand 62 in cross-section is shown on the substrate surface 72. The semicircular cross-section of the strand 62 may be varied by varying the angle alpha shown in FIG. 5 as well as the speed of the substrate 70. The strand has an arcuate portion 74 and a flat portion 76. When the angle alpha is small the cross-section of the metal strand 62 will be almost circular having a relatively small flat portion. As the angle alpha increases the cross-section flattens and the arcuate portion becomes a smaller segment of a circle with a longer flat portion.

Figure 7:
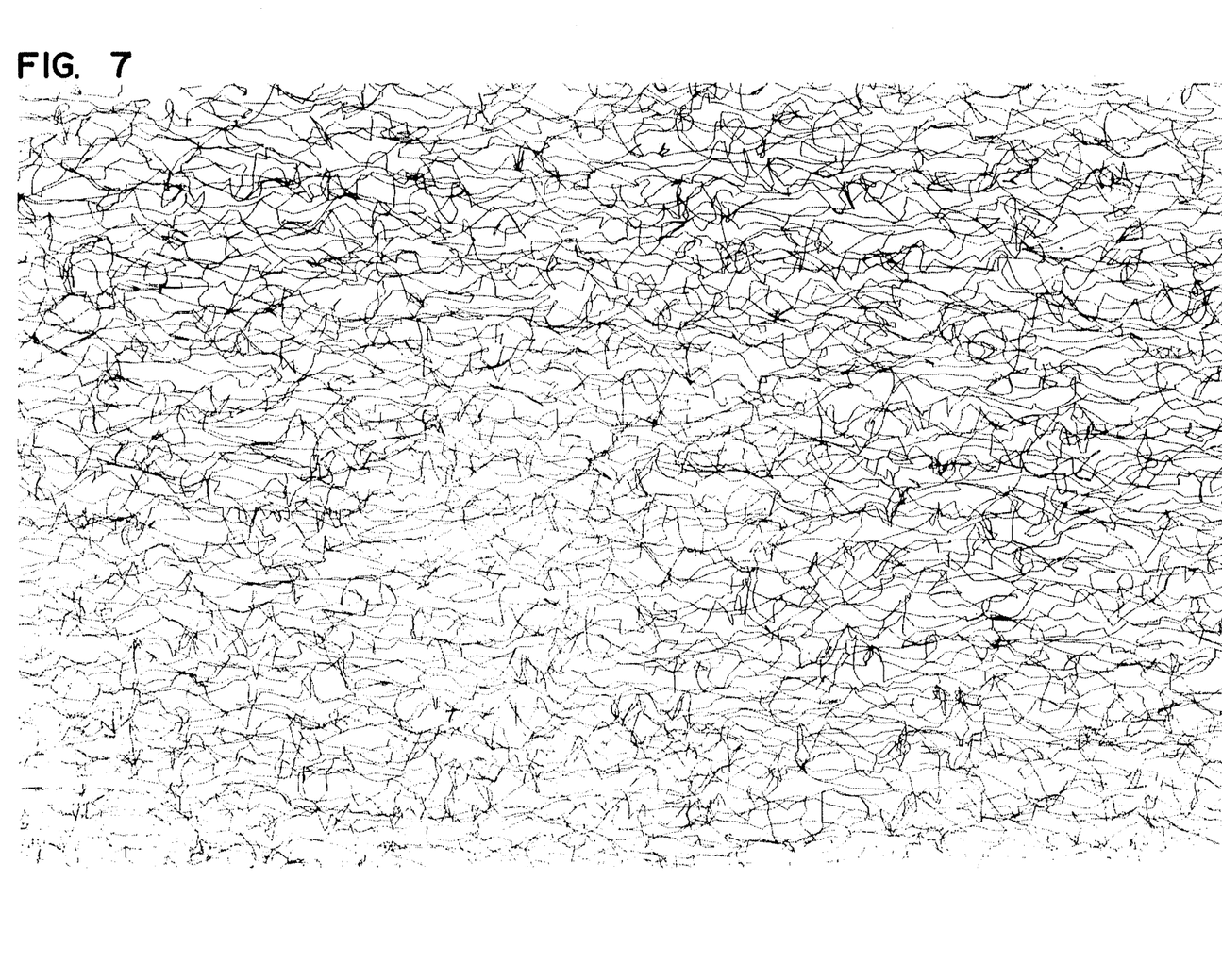
FIG. 7 is a photograph depicting a random configuration of the present invention.

Referring to FIG. 7, a photograph showing a metal/polymer composite of the invention is shown. The metal layer is comprised of a plurality of randomly configured fine metal strands intersecting at various and random fused junctions. The metal layer is electrically conductive in both the X and the Y directions because of the plurality of intersections between the metal strands. The metal/polymer composite shown in FIG. 7 is substantially transparent.

The desired pattern, such as those shown in FIGS. 1–4 and 7, can be produced through a number of means. A plurality of metal dispensers, such as the dispenser 50 in FIG. 5, may be positioned at the desired intervals. In addition, by means of a lathe, the dispenser can be traversed longitudinally while the substrate is rotated at a desired number of revolutions per minute to provide a fine, regular spacing between the strands of metal. The substrate may then be rotated, for example, 90 degrees, and the process repeated to provide a similar repeating configuration of strands in a perpendicular direction.

By utilizing orifices of various diameters and by varying the method of providing the metal strand to the substrate, such as by rotating a substrate on a mandrel, extremely precise and closely-spaced, regular configurations of metal strands may be produced. For example, one preferred embodiment includes strands which are regularly spaced at an average spacing of about 2 to 200 strands per cm. Such strands may be provided, for example, perpendicular to each other, to provide a regularly spaced mesh configuration, or they may be provided, for example, in three directions intersecting each other at 60-degree angles.

In addition, the fine metal strands may be configured in a random configuration such as that shown in FIG. 7. Under certain conditions when a molten metal jet is squirted into air it encounters resistance from the viscosity of the air; this resistance slows the stream and causes the jet to bunch up and become wavy or sinuous at a certain distance from the orifice. The waviness in the molten stream increases with increasing distance from the orifice. When this sinuous jet encounters a moving substrate, the resulting patterns of metal strands on the substrate are also sinuous. Both the average amplitude of the waves and their degree of randomness increases with increasing substrate to orifice distance. The randomness of the pattern is also enhanced by using slower substrate speeds relative to the jet velocity.

The composites of the present invention can be made with fine strands of metal in configurations which block less than 5 percent of the visible light transmitted through the metal configuration. Such composites may be useful where transparency of the composite is desired.

The metal/polymer composites of the present invention may be thermoformed without loss of electrical conductivity or transparency where the melting point of the metal is less than the softening point or melting temperature of the polymer. The metal/polymer composite may be themoformed into any of a number of shapes or configurations, including a variety of relief patterns, such as a plurality of square, round, triangular, or octagonal cavities or the like.

It may be desirable to press the metal layer of the metal/polymer composite of the present invention into the conductor surface of the polymer so that the metal layer is flush with the conductor surface. This configuration can improve the scratch resistance and durability of the fine metal lines of the metal layer. Such a configuration can be made, for example, by passing the metal/polymer composite through a set of heated rollers to press the metal into the polymer.

The invention is further described in the following non-limiting examples.

EXAMPLE 1

A thermoformable metal/polymer composite of the invention was made as follows: a 14 mm internal diameter (I.D.), 0.9 m long Pyrex glass tube, was heated at its midpoint using a propane torch and then gently pulled apart and pinched off to make two, 0.4 m tubes, each with one end whose inside diameter was tapered down to a capillary. The capillary end of one tube was then carefully abraded with #400 grit abrasive paper until the tube had a nozzle opening of 0.15 mm in diameter. The tube was then wrapped with 1.22 m of a 208 watt, 12.5 mm wide resistance heating tape (manufactured by Thermolyne Corp). The glass tube and resistance tape was mounted vertically in a clamping assembly which was mounted on the tool carriage of a lathe. The glass tube was positioned so that the nozzle was spaced 2 mm above a 7.7 cm diameter aluminum mandrel positioned in the chuck of the lathe. A 23 cm by 23 cm by 0.25 mm piece of cast polyethylene terephthalate (PET) sheet was taped to the curved surface of the mandrel with one edge parallel to the cylindrical axis of the mandrel. The glass tube was heated and filled to a height of 30 cm with a 34 wt % bismuth, 66 wt % indium alloy which had been previous melted and heated to 250° C. The metal in the tube exerted a pressure of 25 kPa. A molten jet of metal formed immediately. The lathe was then operated to spin the mandrel at 250 rpm giving a mandrel surface speed of 1 m/sec. The glass tube was advanced by the carriage in a longitudinal direction at a feed rate so as to give 3.175 mm of longitudinal movement for every revolution of the mandrel. The nozzle was positioned so that the metal jet intersected the PET at roughly 90°. A line of metal was thus drawn onto the surface of the PET to create a set of parallel spaced metal lines 3.175 mm apart. The molten metal instantly solidified upon contact with the PET. After the surface of the PET was completely covered with evenly spaced metal lines, the lathe was stopped and the PET piece was rotated 90° and retaped to the mandrel. The lathe was again operated as before to create a second set of parallel metal lines which intersected the first set at 90° making a square pattern of 3.175 mm spaced lines. The lines were 0.3 mm wide and roughly 0.1 mm thick. The resulting sample was placed into a Long ® stretcher, heated to 150° C. and stretched simultaneously along two perpendicular axes parallel to the square edges of the film. The film was stretched 250% in both directions without the lines losing their electrical conductivity.

EXAMPLE 2

A metal/polymer composite similar to that described in Example 1 was made, except that the 7.7 cm diameter aluminum mandrel was replaced with a 15.4 cm diameter aluminum mandrel, and the glass tube and nozzle were replaced with a 1.28 cm diameter by 0.6 m long stainless steel tube with a #27 G ½ Becton Dickinson Co. hypodermic needle brazed into one end. The needle was pinched off slightly, giving it an effective nozzle diameter of 200 m. The stainless steel tube was filled to a level 0.46 m above the nozzle with a 42 wt % tin, 58 wt% bismuth alloy which had been previously melted and heated to 250° C. As in Example 1, the metal lines were substrate taped to the aluminum mandrel. A 36 cm by 36 cm by 0.25 mm piece of Kodar ® PETG copolyester 6763 manufactured by Eastmann Kodak was used as the substrate. The lathe was spun at 250 rpm giving a mandrel surface speed of 2 m/sec. The lathe carriage was fed at a constant rate of 3.1 mm per revolution. Two sets of parallel metal lines were drawn on the substrate. The lines in each set were 3.1 mm apart and the sets of lines intersected one another at roughly 90°. The width of the lines was 0.4 mm and the thickness was roughly 0.1 mm at the center of the line. The metal pattern was tested for thermoformability by vacuum thermoforming the sample using a die which had an array of ten 2.5 cm by 1.9 cm by 1.3 cm deep cavities. The PETG substrate was heated for 15 seconds in the thermoformer heater which was set to 316° C., and then vacuum formed with the surface of the PETG substrate having the metal lines away from the forming die. In places the lines on the resulting thermoformed sample stretched 250% in two perpendicular directions without losing electrical conductivity.

EXAMPLE 3

A metal/polymer composite was prepared as follows: a 46.15 cm long, 14 mm ID quartz glass tube was prepared in a manner similar to that used to prepare the tube in Example 1, except that an oxygen-acetylene torch was used to melt the quartz to form a nozzle. The resulting tube had a nozzle diameter of 0.13 mm. It was clamped onto the lathe carriage in a manner similar to Example 1. A 48 wt % tin, 52 wt % indium alloy was heated to 250° C. and poured into the tube. The tube was then pressurized using Argon gas. The orifice of the tube was positioned 2 mm from the aluminum mandrel. A series of experiments were then carried out to study the variables of pressure, substrate speed, and nozzle angle. Cast PET substrates of 36 cm by 36 cm by 0.25 mm were used in these experiments. In the first experiment, the lathe rotational speed was set to 250 rpm (2 m/sec surface speed). The angle between the nozzle and the substrate was a constant 45° measured between the jet and the tangent to the substrate in the direction of the approaching substrate. The pressure was slowly increased as the nozzle was swept longitudinally at a constant rate of 3.1 mm per revolution. Continuous lines did not form until the pressure reached 48 kPa. Between 48 and 138 kPa the line width increased from 0.25 mm to 0.7 mm but the line thickness stayed constant at 0.08 mm.

EXAMPLE 4

A composite as described in Example 3 was made except that the nozzle pressure was held constant at 90 kPa and the substrate speed was varied from 1.7 m/sec (214 rpm) to 3.97 m/sec (500 rpm). The resulting lines had a constant width of 0.5 mm but the thickness changed from 0.1 mm to 0.04 mm.

EXAMPLE 5

A composite as described in Example 3 was made except that the nozzle pressure was kept constant at 90 kPa and the substrate speed was kept constant at 2 m/sec (250 rpm). The nozzle angle was changed from 150° to 20°. The main effect was a change in the shape of the lines from a flat line of 1.2 mm width and 0.03 mm thickness at 150° to a semicircular line of 0.3 mm width and 0.1 mm thickness at 20°.

EXAMPLE 6

A composite was made on a 15 cm by 45 cm by 0.5 mm piece of PET in a manner similar to the method of Example 3. The lathe speed was set at 355 rpm (2.8 m/sec surface speed), the nozzle diameter was 0.125 mm, the nozzle pressure was 138 kPa, and the nozzle to substrate distance was 56 cm. The molten jet impinged the substrate at an angle of 45°. Under these conditions, the resulting lines were wavy and irregular, giving an overall random appearance to the resulting metal pattern. The nozzle was traversed longitudinally at a rate of 2.1 mm per revolution. Although the lines were only drawn in one direction, the resulting sample had continuous electrical continuity in all directions since adjacent lines intersected one another due to their waviness.

EXAMPLE 7

A composite was made in a manner similar to Example 6 except that the nozzle to substrate distance was 58 cm, the impingement angle was 30°, the pressure was 90 kPa, and the transverse movement of the nozzle per revolution was 1.6 mm. The resulting composite is depicted in FIG. 7.

EXAMPLE 8

A composite was made by drawing a set of parallel lines were drawn on a 30.5 cm by 30.5 cm by 0.25 mm piece of PETG in a manner similar to the method of Example 3. The lathe speed was 250 rpm (2 m/sec surface speed), the nozzle diameter was 0.08 mm, the nozzle pressure was 276 kPa, and the nozzle to substrate distance was 8 cm. Under these conditions, the resulting lines were wavy, with a rough wave amplitude of 1 mm and a rough wavelength of 3 mm. The nozzle was traversed longitudinally at a rate of 1 mm per revolution. Although the lines were only drawn in one direction, the resulting sample had continuous electrical continuity in all directions as the waviness resulted in intersection between adjacent lines.

EXAMPLE 9

A composite was prepared as described in Example 8. A piece of smooth 0.005 mm polymide was then placed against the side of the PETG having the metal lines and passed through a laminator with 15.4 cm diameter rolls heated to 138° C. The web rate through the rolls was 0.91 m/min and the sample was passed through the laminator 3 times. The result of this experiment was that the metal lines were pushed into the plastic so that the surface of the metal lines was flush with the PETG surface. The composite had superior resistance to scratching of the metal lines.

EXAMPLE 10

A series of composites having a square mesh pattern was prepared in a manner similar to Example 3. The nozzle diameter was 0.06 mm, the nozzle pressure was 230 kPa, the nozzle to substrate distance was 5 mm, and the web speed was 2 m/sec. The metal was eutectic tinbismuth. The resulting lines were 0.15 mm wide and 0.05 mm thick. The composites were tested for shielding capability, and the results are set forth in Table 1.

TABLE 1

| Mesh (lines/inch) | EMI shielding dB at | | | |
|---|---|---|---|---|
| | 30 MHz | 100 MHz | 300 MHz | 1000 MHz |
| 20 | 19 | 20 | 37 | 23 |
| 28 | 25 | 26 | 43 | 27 |
| 32 | 27 | 27 | 45 | 30 |
| 46 | 30 | 32 | 46 | 34 |
| 56 | 33 | 34 | 46 | 38 |
| 64 | 34 | 35 | 54 | 37 |
| 80 | 37 | 39 | 52 | 41 |
| 104 | 38 | 42 | 57 | 37 |
| 210 (solid) | 45 | 53 | 68 | 55 |

EXAMPLE 11

A composite was made as follows: a roll of 20.5 cm wide by 0.05 mm thick PET was mounted on an inspection stand. This stand consists of an unwind roll and a windup roll spaced 0.61 m apart to allow convenient inspection of webs. A third roll was mounted in the stand so that the polymer film would pass against the third roll during a winding or unwinding operation. A stainless steel tube and nozzle similar to that described in Example 2 was positioned above the third roll, so that a polymer film would pass between the roll and the nozzle. The nozzle was positioned 2 mm from the film and at an angle of 45° from the film, measured between the metal jet and the longitudinal direction of approach of the film. The nozzle was also mounted on a transverse slide so that it could move freely from side to side, traversing the film. The takeup roll was driven by a variable speed motor so that the film could move at speeds of about 0 to 2 m/sec. The stainless steel tube and nozzle were heated and filled with molten indium at 200° C. and the PET web was accelerated to 2 m/sec. The stainless steel tube and nozzle were heated and filled with molten indium at 200° C. and the PET web was accelerated to 2 m/sec. A continuous line of indium metal was drawn on the PET. The nozzle was traversed back and forth to make a metal line in the form of a sine wave of 15.2 cm amplitude and 91 cm wavelength.

EXAMPLE 12

A composite was made as follows: Using the procedures outlined in Examples 1 and 2, a set of parallel tin/bismuth metal lines was drawn onto a 30.5 cm by 0.05 mm piece of polyimide. The nozzle was the same hypodermic needle mounted in a stainless steel tube as was used in Example 2. A set of lines 3 mm apart was drawn onto the polyimide in one direction. A 30.5 cm by 30.5 cm by 0.25 mm piece of PET was then taped to the mandrel and a similar set of lines was drawn on the PET. The PET and the polyimide were placed against one another so that the lines of the polyimide were in contact with and intersected the lines of the PET at an angle of 90°. The PET and polyimide were then passed through a laminator in which the rolls were heated to 180° C. The metal lines on the polyimide melted and transferred to the PET to make a square mesh pattern on the PET. The metal lines were transferred because of the limited adhesion between the metal and the polyimide. The polyimide can be repeatedly reused for this purpose.

EXAMPLE 13

A composite was made as follows: A set of parallel lines was drawn onto a 30.5 cm by 30.5 cm by 0.05 cm piece of polyimide following a procedure as in Example 12. In this case, however, two sets of lines intersecting at 90° were drawn onto the polyimide. The polyimide was then placed against a similar size piece of PET of 0.25 mm thickness so that the metal lines were in contact with the PET. The two pieces were then passed through a laminator as in Example 12. The square mesh pattern was transferred from the polyimide to the PET.

EXAMPLE 14

A composite was made as follows: A set of parallel lines was drawn onto a 30.5 cm by 30.5 cm by 0.05 mm piece of polyimide in a manner similar to Example 12. Two 15.2 cm by 15.2 cm pieces were cut from this piece. A 15.2 cm by 15.2 cm by 0.25 mm cast PET film was placed against one of the polyimide pieces so that the metal lines were touching the polyimide. The two contacting pieces were then passed through the laminator, transferring the set of metal lines from the polyimide to the PET. The second 15.2 cm by 15.2 cm piece of polyimide was then placed against the piece of PET with the lines on the polyimide contacting and intersecting the lines on the polyester at 90°. These pieces were passed through the laminator again so that the lines from the polyimide were transferred to the PET, making a square mesh pattern on the PET.

EXAMPLE 15

A set of parallel lines spaced 1 mm apart were drawn on two 30.5 cm by 30.5 cm pieces of cast PET. The PET pieces were placed against one another so that the metal lines were touching and intersecting at 90°. A sheet of 0.05 mm polyimide was placed on each side of the PET to keep the PET from sticking to the laminator rolls. It was then passed through the laminator which was set to 180° C. and 0.91 m/min web speed. The two pieces of PET to be bonded to one another with a square mesh pattern of tin/bismuth sandwiched in between. The composite was then vacuum thermoformed in a manner similar to that used in Example 2, except the composite was heated for 30 seconds at 316° C.

What is claimed is:

1. A thermoformable metal/polymer composite comprising a polymeric substrate and a discontinuous metal layer, said metal layer comprising a plurality of fine metal strands provided on said substrate, said metal strands individually having a cross-section with an area of about 100 to 100,00 $\mu m^2$ and said cross-section having a flat portion and an arcuate portion, said metal strands having a melting point of less than the softening or melting temperature of said polymeric substrate.

2. The composite of claim 1 wherein the area of said cross-section is about 100 to 10,000 $\mu m^2$.

3. The composite of claim 1 wherein the area of said cross-section is about 100 to 7500 $\mu m^2$.

4. The composite of claim 1 wherein said plurality of fine metal strands have a plurality of fused junctions.

5. The composite of claim 1 wherein said metal layer is transparent and electrically conductive.

6. The composite of claim 5 wherein said metal layer is in a mesh configuration.

7. The composite of claim 6 wherein said mesh comprises a plurality of regularly spaced horizontal strands and a plurality of regularly spaced vertical strands substantially perpendicular to said horizontal strands.

8. The composite of claim 7 wherein said vertical and horizontal strands are regularly spaced at an average spacing of between 2 and about 200 strands per cm.

9. The composite of claim 5 wherein said metal layer comprises a random, wandering configuration of the metal strands.

10. The composite of claim 1 wherein said metal is a substantially pure metal or mixture of metals and is substantially undrawn.

11. The composite of claim 10 wherein said metal is selected from the group consisting of: tin, lead, bismuth, zinc, indium, aluminum, and mixtures thereof.

12. The composite of claim 1 wherein said polymer is a homopolymer or oligopolymer comprising monomers selected from the group consisting of polyesters, polyamides, polyimides, polyolefins, polyurethanes, polysulfones, polyethers, polycarbonates, cellulose esters, halogenated polyolefins, polyacetals, polystyrenes, and vinyl polymers.

13. The composite of claim 12 wherein said monomers are polyesters formed from terephthalic acid and one or more diols selected from the group consisting of ethylene glycol, propylene glycol, 1,4 butanediol, 1,6 hexanediol, and 1,4 cyclohexane dimethanol.

14. The composite of claim 2 wherein said composite is thermoformed.

15. The composite of claim 14 wherein said composite is stretched at least 50% during thermoforming.

16. The composite of claim 15 wherein said composite is stretched at least 200% during thermoforming.

17. The composite of claim 14 wherein said composite is stretched in certain regions at least 200% during thermoforming.

18. The composite of claim 10 wherein said metal layer blocks less than 5% of visible light transmitted therethrough.

19. A method of forming a thermoformable metal/polymer composite comprising the steps of:
   (a) providing a polymeric substrate, and (b) squirting a plurality of fine molten metal strands onto said substrate wherein said metal strands individually have a cross-section with an area of about 100 to 100,000 $\mu m^2$ and said cross-section having a flat portion and an arcuate portion, said metal having a melting point of less than the softening or melting temperature of said polymeric substrate.

20. The method of claim 19 wherein said metal layer is transparent and electrically conductive.

21. The method of claim 20 wherein said metal is a substantially pure metal or mixture of metals and is substantially undrawn.

22. The method of claim 21 further including the step of thermoforming said composite.

23. The method of claim 22 wherein said composite is stretched at least 50% during thermoforming.

24. The method of claim 23 wherein said composite is stretched at least 200% during thermoforming.

25. The method of claim 22 wherein said composite is stretched in certain regions at least 200% during thermoforming.

26. The process of claim 22 wherein the composite is shrunk by at least 25% during thermoforming.

27. The method of claim 19 further including transfering said metal layer to a second similar metal/polymer composite.

28. The method of claim 19 further including embedding said metal layer into said substrate so that said metal layer becomes substantially flush with said substrate.

29. A metal/polymer composite made by the method of claim 19.

30. A metal/polymer composite made by the method of claim 21.

* * * * *

UNITED STATES PATENT AND TRADEMARK OFFICE
CERTIFICATE OF CORRECTION

PATENT NO. : 5,028,490

DATED : July 2, 1991

INVENTOR(S) : Koskenmaki, et al.

It is certified that error appears in the above-identified patent and that said Letters Patent is hereby corrected as shown below:

Col. 2, line 2, "therefor" should read -- therefore --

Col. 2, line 64, delete "a" after the word "in"

Col. 4, line 3, "(Noryl R)" should read -- (Noryl$^R$) --

Col. 4, line 6, delete "copolymers." after the word "polystyrene"

Col. 4, line 6, insert -- styrene copolymers, blends and graft copolymers; and the alkenyl aromatic resins typified by polystyrene copolymers. -- after the word "polystyrene"

Col. 5, line 29, "patten" should read -- pattern --

Col. 7, line 67, "34 wt %" should read -- 34 Wt.-%--

Col. 7, line 67, "66 wt %" should read -- 66 wt.-% --

Col. 7, line 68, "previous" should read -- previously --

UNITED STATES PATENT AND TRADEMARK OFFICE
CERTIFICATE OF CORRECTION

PATENT NO. : 5,028,490

DATED : July 2, 1991

INVENTOR(S) : Koskenmaki, et al.

It is certified that error appears in the above-identified patent and that said Letters Patent is hereby corrected as shown below:

Col. 8, line 20, "Long R " should read -- Long$^R$ --

Col. 8, line 36 and 37, "42 wt %" should read -- 42 wt.-% -- "58 wt %" should read -- 58 wt.-% --

Col. 8, line 40, "Kodar R " should read -- Kodar$^R$ --

Col. 9, line 1, "48 wt%" should read -- 48 wt. -% --

Col. 9, line 1, "52 wt%" should read -- 52 wt. -% --

Col. 9, line 65, delete "were drawn" after the word "lines"

Col. 10, line 13, "polymide" should read -- polyimide --

C0l. 11, line 54, "polyester" should read -- polyimide --

Col. 12, line 11, "100,00" should read -- 100,000 --

Col. 14, lines 8 and 9, "transfering" should read -- transferring --

Signed and Sealed this

Third Day of December, 1991

Attest:

HARRY F. MANBECK, JR.

Attesting Officer     Commissioner of Patents and Trademarks